(12) United States Patent
Al-Shareef et al.

(10) Patent No.: US 6,255,186 B1
(45) Date of Patent: Jul. 3, 2001

(54) METHODS OF FORMING INTEGRATED CIRCUITRY AND CAPACITORS HAVING A CAPACITOR ELECTRODE HAVING A BASE AND A PAIR OF WALLS PROJECTING UPWARDLY THEREFROM

(75) Inventors: Husam N. Al-Shareef; Scott Jeffery DeBoer, both of Boise, ID (US); Randhir P. S. Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/137,780

(22) Filed: Aug. 20, 1998

Related U.S. Application Data

(62) Division of application No. 09/083,257, filed on May 21, 1998.

(51) Int. Cl.[7] .................................................. H01L 21/20
(52) U.S. Cl. .......................... 438/396; 438/239; 438/240; 438/253; 438/659
(58) Field of Search ..................................... 438/104, 394, 438/396, 514, 575, 658, 659, 171, 190, 210, 238–240, 253

(56) References Cited

U.S. PATENT DOCUMENTS

| 4,333,808 | 6/1982 | Bhattacharya et al. | 204/192.22 |
|---|---|---|---|
| 4,464,701 | 8/1984 | Roberts et al. | 361/313 |
| 4,891,682 | 1/1990 | Yusa et al. | 257/258 |
| 4,952,904 | 8/1990 | Johnson et al. | 338/36 |

(List continued on next page.)

FOREIGN PATENT DOCUMENTS

| 1-222469 | 5/1989 | (JP) . |
|---|---|---|
| 5-221644 | 8/1993 | (JP) . |
| 405343641 | 12/1993 | (JP) . |
| 6-021333 | 1/1994 | (JP) . |

OTHER PUBLICATIONS

H. Shinriki and M. Nakata, IEEE Transaction On Electron Devices vol 38 No 3 Mar. 1991.

Anonymous Research Disclosure, 1989R D–0299041 titled "Double High Dielectric Capacitor", Derewent–Week 198917 (Derwent World Patent Index).

(List continued on next page.)

*Primary Examiner*—Carl Whitehead, Jr.
*Assistant Examiner*—Jamie L. Davis
(74) *Attorney, Agent, or Firm*—Wells, St. John, Roberts, Gregory & Matkin P.S.

(57) ABSTRACT

In accordance with one implementation the invention, a capacitor comprises two conductive capacitor electrodes separated by a capacitor dielectric layer, with at least one of the capacitor electrodes comprising at least one of Pt and Pd, and also comprising another metal which is capable of forming a conductive metal oxide when exposed to oxidizing conditions. In accordance with another. implementation, integrated circuitry includes a conductive silicon containing electrode projecting from a circuit node. A capacitor is received over the silicon containing electrode and comprises a first capacitor electrode having at least one of Pt and Pd, and also comprising another metal which is capable of forming a conductive metal oxide when exposed to oxidizing conditions. A high K capacitor dielectric layer received over the first capacitor electrode. A second capacitor electrode is received over the high K capacitor dielectric layer. In another implementation, a capacitor electrode comprises at least one of Pt and Pd and a conductive metal oxide, with the electrode having a base and a pair of walls projecting upwardly therefrom. The base has a greater concentration of the conductive metal oxide than any concentration of the conductive metal oxide in the walls. Methods of fabricating capacitors are also disclosed.

6 Claims, 2 Drawing Sheets

U.S. PATENT DOCUMENTS

| | | | |
|---|---|---|---|
| 5,053,917 | 10/1991 | Miyasaka et al. | 361/321.5 |
| 5,079,191 | 1/1992 | Shinriki et al. | 438/393 |
| 5,142,438 | 8/1992 | Reinberg et al. | 361/313 |
| 5,191,510 | 3/1993 | Huffman | 361/313 |
| 5,234,556 | 8/1993 | Oishi et al. | 204/157.51 |
| 5,279,985 | 1/1994 | Kamiyama et al. | 438/396 |
| 5,293,510 | 3/1994 | Takenaka | 257/295 |
| 5,316,982 | 5/1994 | Taniguchi | 438/396 |
| 5,330,935 | 7/1994 | Dobuzinsky et al. | 438/767 |
| 5,335,138 | 8/1994 | Sandhu et al. | 361/303 |
| 5,348,894 | 9/1994 | Gnade et al. | 438/396 |
| 5,352,623 | 10/1994 | Kamiyama | 438/396 |
| 5,362,632 | 11/1994 | Mathews | 438/152 |
| 5,372,859 | 12/1994 | Thakoor | 427/551 |
| 5,397,446 | 3/1995 | Ishihara et al. | 204/192.18 |
| 5,442,213 | 8/1995 | Okudaira | 257/310 |
| 5,466,629 | 11/1995 | Mihara et al. | 438/3 |
| 5,468,687 | 11/1995 | Carl et al. | 438/393 |
| 5,471,364 | 11/1995 | Summerfelt et al. | 257/295 |
| 5,504,041 | 4/1996 | Summerfelt | 438/396 |
| 5,508,953 | 4/1996 | Fukuda et al. | 365/145 |
| 5,510,651 | 4/1996 | Maniar et al. | 257/751 |
| 5,552,337 | 9/1996 | Kwon et al. | 438/396 |
| 5,555,486 | 9/1996 | Kingon et al. | 361/305 |
| 5,561,307 | 10/1996 | Mihara et al. | 257/295 |
| 5,585,300 | 12/1996 | Summerfelt | 505/330 |
| 5,617,290 | 4/1997 | Kulwicki et al. | 361/321.4 |
| 5,641,702 | 6/1997 | Imai et al. | 438/396 |
| 5,654,222 | 8/1997 | Sandhu et al. | 438/3 |
| 5,663,088 | 9/1997 | Sandhu et al. | 438/396 |
| 5,688,724 | 11/1997 | Yoon et al. | 438/778 |
| 5,728,603 | 3/1998 | Emesh et al. | 438/3 |
| 5,780,359 | 7/1998 | Brown et al. | 438/659 |
| 5,786,248 | 7/1998 | Schuegraf | 438/240 |
| 5,790,366 | 8/1998 | Desu et al. | 361/305 |
| 5,798,903 | 8/1998 | Dhote et al. | 361/321.4 |
| 5,807,774 * | 9/1998 | Desu et al. | 438/240 |
| 5,814,852 | 9/1998 | Sandhu et al. | 257/310 |
| 5,837,591 | 11/1998 | Shimada et al. | 438/381 |
| 5,837,593 | 11/1998 | Park et al. | 438/240 |
| 5,838,035 | 11/1998 | Ramesh | 257/295 |
| 5,843,830 | 12/1998 | Graettinger et al. | 438/396 |
| 5,844,771 | 12/1998 | Graettinger et al. | 361/303 |
| 5,899,740 | 5/1999 | Kwon | 438/627 |
| 5,910,218 | 6/1999 | Park et al. | 118/719 |
| 5,916,634 | 6/1999 | Fleming et al. | 427/255.392 |
| 5,930,584 | 7/1999 | Sun et al. | 438/3 |
| 5,990,507 | 11/1999 | Mochizuki et al. | 257/295 |
| 6,010,744 * | 1/2000 | Buskirk et al. | 427/81 |
| 6,015,989 | 1/2000 | Horikawa et al. | 257/309 |
| 6,027,969 | 2/2000 | Huang et al. | 438/254 |
| 6,028,360 | 2/2000 | Nakamura et al. | 257/758 |
| 6,046,469 * | 4/2000 | Yamazaki et al. | 257/306 |
| 6,051,859 | 4/2000 | Hosotani et al. | 257/306 |

OTHER PUBLICATIONS

S. Wolf and R.N. Tauber, *Silicon Processing for the VLSI Era,* vol. 2, Lattice Press, pp. 589–591.

M.A. Farooq, S.P. Murarka, C.C. Chang, F.A. Baiocchi, Tantalum nitride as a discussion barrier between $Pd_2Si$, $CoSi2$ and aluminum, 1989, American Institute of Physics, pp. 3017–3022.

McIntyre, Paul C. et al., "Kinetics And Mechanisms of TiN Oxidation Beneath Pt/TiN Films", *J. Appl. Phys.,* vol. 82, No. 9, pp. 4577–4585 (Nov. 1997).

Onishi, Shigeo et al., "A Half–Micron Ferroelectric Memory Cell Technology With Stacked Capacitor Structure", *I.E.E.E.*, IDEM 94–843, pp. 843–6 (1994).

Eimori, T., et al. "Newly Designed Planar Stacked Capacitor Cell with High Dielectric Constant Film for 256Mbit DRAM" *I.E.E.E.*, IEDM 93–631–4, pp. 631–4 (1993).

Fazan, P.C., et al., "A High–C Capacitor ($20.4fF/\mu m^2$) with Ultrathin $CVD-Ta_2O_5$ Films Deposited on Rugged Poly–Si for High Density DRAMs", *I.E.E.E.*, pp. 263–266 (1992).

Lesaicherre, P–Y, et. al., "A Gbit–Scale DRAM Stacked Capacitor Technology with ECR MOCVD $SrTiO_3$ and RIE Patterned $RuO_2$/TiN Storage Nodes", *I.E.E.E.*, pp. 831–834 (1994).

Yamaguchi, H., et. al., "Structural and Electrical Characterization of $SrTiO_3$ Thin Films Prepared by Metal Organic Chemical Vapor Deposition", *Jpn. J. Appl. Phys.,* vol. 32 (Pt. 1, No. 9B), pp. 4069–4073 (1993).

Kamiyama, S., et. al., "Highly Reliable 2.5nm $Ta_2O_5$ Capacitor Process Technology for 256Mbit DRAMs", *I.E.E.E.*, pp. 827–830 (1991).

Kamiyama, S., et al., "Ultrathin Tantalum Oxide Capacitor Dielectric Layers Fabricated Using Rapid Thermal Nitridation Prior to Low Pressure Chemical Vapor Deposition", *J. Electrochem. Soc.,* vol. 140, No. 6, pp. 1617–1625 (Jun. 1993).

* cited by examiner

METHODS OF FORMING INTEGRATED CIRCUITRY AND CAPACITORS HAVING A CAPACITOR ELECTRODE HAVING A BASE AND A PAIR OF WALLS PROJECTING UPWARDLY THEREFROM

RELATED PATENT DATA

This patent resulted from a divisional application of U.S. patent application Ser. No. 09/083,257, filed May 21, 1998, entitled "Capacitors, Methods Of Forming Capacitors, and Integrated Circuitry", naming Husam N. Al-Shareef, Scott Jeffrey DeBoer, and Randhir P. S. Thakur as inventors, the disclosure of which is incorporated by reference.

TECHNICAL FIELD

This invention relates to capacitors, to methods of forming capacitors and to integrated circuitry.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256Mb DRAMs will be on the order of 0.25 micron or less, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials, such as ferroelectric materials or perovskite material or pentoxides such as tantalum pentoxide, have high dielectric constants and low leakage current which make them attractive as cell dielectric materials for high density DRAMs and non-volatile memories. Perovskite material and other ferroelectric materials exhibit a number of unique and interesting properties. One such property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Despite the advantages of high dielectric constants and low leakage, insulating inorganic metal oxide materials suffer from many drawbacks. For example, all of these materials incorporate oxygen or are otherwise exposed to oxygen for densification to produce the desired capacitor dielectric layer. Unfortunately, the provision of such layers or subjecting such layers to oxidation densification also undesirably oxidizes the underlying bottom or lower storage node plate, which is typically conductively doped polysilicon. For example, $Ta_2O_5$ is typically subjected to an anneal in the presence of an oxygen ambient. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing one or more of $O_3$, $N_2O$ and $O_2$. The oxygen containing gas is typically flowed through a reactor at a rate of from about 0.5 slm to about 10 slm.

Due to the highly oxidizable nature of polysilicon, alternate materials for capacitor electrodes have been considered. Noble metals, such as platinum or palladium, are examples. Such metals are extremely resistant to oxidation, but can be diffusive to oxygen. Certain capacitor constructions might utilize platinum electrodes over conductive silicon nodes. In such instances, oxygen diffusion through platinum or palladium could react with the silicon creating a secondary capacitor or insulative barrier.

An art accepted solution to avoiding oxidation of silicon is to provide an intervening oxidation barrier layer thereover. This layer is accordingly desirably highly electrically conductive. There are a limited number of oxidation barrier materials which are conductive. Further even with oxidation barriers, some oxidation of the underlying silicon can occur at the more elevated oxidation anneal temperatures for the high K dielectric materials. High temperature anneals in non-oxidizing atmospheres have been used as a substitute for the oxygen anneal. Such have the advantage of achieving or repairing crystal structure without oxidizing the underlying silicon. However, the lack of oxygen prevents significant densification and homogenous production of the stoichiometric oxide. Thus, less than desirable dielectric constant will typically be achieved.

SUMMARY OF THE INVENTION

In accordance with one implementation the invention, a capacitor comprises two conductive capacitor electrodes separated by a capacitor dielectric layer, with at least one of the capacitor electrodes comprising at least one of Pt and Pd, and also comprises another metal which is capable of forming a conductive metal oxide when exposed to oxidizing conditions. In accordance with another implementation, integrated circuitry includes a conductive silicon containing electrode projecting from a circuit node. A capacitor is received over the silicon containing electrode and comprises a first capacitor electrode having at least one of Pt and Pd, and also comprising another metal which is capable; of forming a conductive metal oxide when exposed to oxidizing conditions. A high K capacitor dielectric layer is received over the first capacitor electrode. A second capacitor electrode is received over the high K capacitor dielectric layer. In another implementation, a capacitor electrode comprises at least one of Pt and Pd and a conductive metal oxide, with the electrode having a base and a pair of walls projecting upwardly therefrom. The base has a greater concentration of the conductive metal oxide than any concentration of the conductive metal oxide in the walls. Methods of fabricating capacitors are also disclosed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
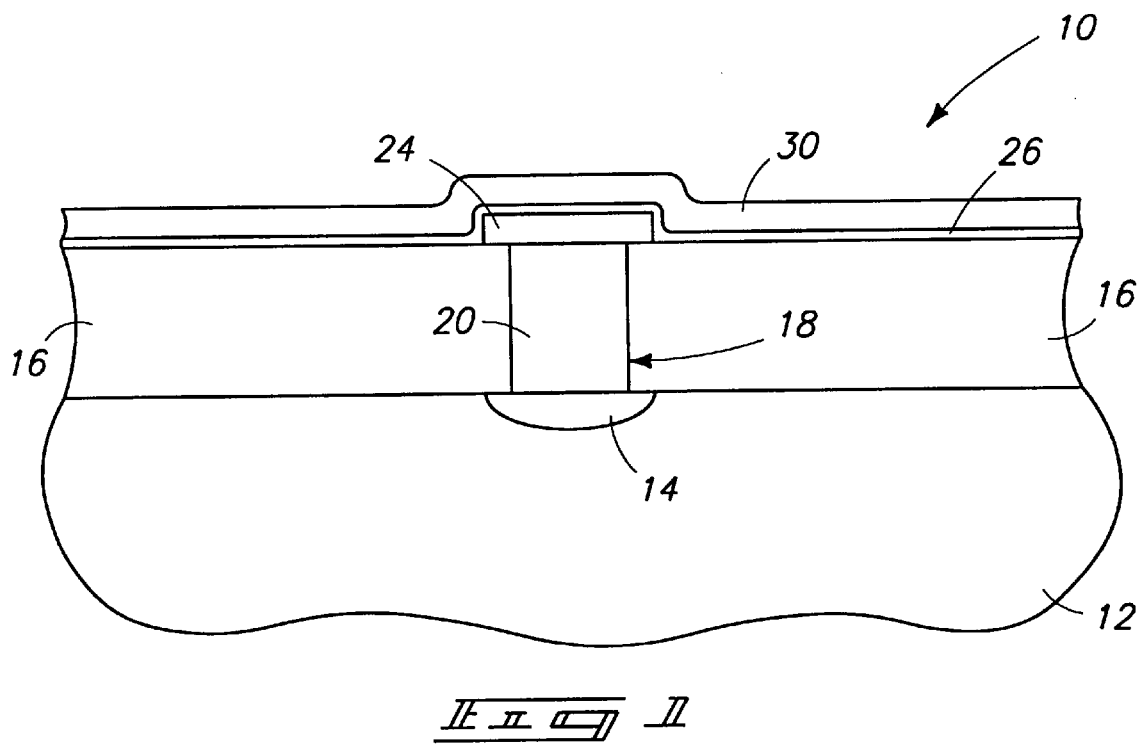
FIG. 1 is a diagrammatic view of a semiconductor wafer fragment at one processing step in accordance with the invention.

Referring to FIG. 1, a semiconductor wafer fragment or substrate is indicated generally with reference numeral 10. To aid in interpretation of the claims that follow, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductor substrates described above.

Fragment 10 comprises a bulk monocrystalline silicon substrate 12 having a conductive diffusion region 14 formed therein. An insulating dielectric layer 16, such as borophosphosilicate glass, is formed over bulk wafer 12 and is provided to have a planar upper surface. A contact opening 18 is formed through insulating layer 16 to diffusion region 14. Conductive plugging material 20 fills opening 18, with an example and preferred composition being conductively doped polysilicon. Such can be formed, for example, by chemical vapor deposition using $SiH_4$ as a precursor gas at a temperature of 535° C. and a pressure of 200 mTorr, followed by a suitable crystallization anneal. Diffusion barrier layers might also be utilized in conjunction with material 20, either at the base proximate diffusion region 14 or proximate the upper surface of layer 16. Example materials are ruthenium and titanium nitride. For example, TiN can be formed by chemical-vapor deposition using an organic precursor. An example process utilizes precursors of $((CH_3)_2N)_4Ti$ at 150 sccm and $N_2$ at 80 sccm at a temperature of 420° C. and a pressure of 0.7 Torr. The illustrated plugging construction can be produced by initially forming conductively doped polysilicon to overfill opening 18. Such layer can then be etched back by wet or dry etches, or by chemical-mechanical polishing, to a point where all of conductive material 20 has been removed from over the upper surface of insulating layer 16.

In the context of this example, conductive polysilicon plug 20 constitutes an electrode projecting from a circuit node, in this example with the circuit node being in the form of conductive diffusion region 14. Discussion proceeds in the preferred embodiment faith respect to fabrication of a capacitor over. polysilicon electrode 20.

Specifically, a capacitor electrode layer is deposited over the outer surface of layer 16 and in contact with plugging material 20. Such is patterned to form a first capacitor electrode 24. Such comprises at least one of Pt and Pd, and another metal which is capable of forming a conductive metal oxide when exposed to oxidizing conditions. Examples of such additional metals include Ru, Ir, Mo, Rh, Re, and mixtures thereof. Electrode 24 is preferably formed to predominately comprise platinum or palladium, or a mixture thereof, and the additional metal. More preferably at least as initially formed, the capacitor electrode is provided to consist essentially of platinum or palladium, or a mixture thereof, and the additional metal. The additional metal or metals concentration in the capacitor electrode is preferably provided at a concentration of less than or equal to about 10% atomic, and more preferably less than or equal to 5% atomic and greater than 0.5% atomic.

An example technique for forming layer 24 comprises chemical vapor depositing the at least one of Pd and Pt with the other metal being provided within the electrode in situ during the chemical vapor deposition. Alternately by way of example only, capacitor electrode layer 24 can initially be formed by chemical vapor or other deposition methods, and the additional metal subsequently ion-implanted therein. An example chemical vapor deposition process for depositing elemental Pt utilizes a liquid precursor of methylcyclopentadienyl trimethyl platinum through which helium at a rate of 200 sccm is bubbled. Wafer temperature is maintained at 275° C., with pressure being 30 Torr. Where for example ruthenium is to be chemical vapor deposited in situ during formation of such platinum layer, an example process would include bubbling a carrier gas such as helium through a liquid precursor of ruthenium tricarbonyl cyclohexadienyl simultaneously with feeding the above example platinum precursor.

The additional or another metal can be provided to be substantially homogeneously distributed throughout electrode 24. Alternately and perhaps more preferably, such metal in the one electrode can be concentrated away from an overlying capacitor dielectric layer to be formed. Alternately considered, the metal can be formed to be concentrated more proximate to polysilicon plug 20. Positioning a greater concentration in this manner may facilitate function of the additional metal atoms as a diffusion barrier to silicon out-diffusion from plug 20 into or through electrode layer 24. Provision of such concentrated region of the subject metal more proximate plug 20 could be accomplished by selecting a suitable implant energy for ion implantation. Alternately, the precursor gas during an in situ chemical vapor deposition of layer 24 which provides the additional metal could be used initially and then terminated or reduced in flow.

A capacitor dielectric layer 26 is formed over first capacitor electrode 24. The invention is seen to have its greatest applicability where capacitor dielectric layer 26 is formed to be a high K and oxygen-containing dielectric layer. In the context of this document, "high K" defines any dielectric constant of at least 20. Example and preferred materials for layer 26 are $(Ba,Sr)TiO_3$, $SrTiO_3$, $(Pb,Zr)TiO_3$, $Ta_2O_5$ and $Nb_2O_5$. As one example, a process for depositing (Ba,Sr)$TiO_3$ includes utilizes precursors of $Ba(DPM)_2$, $Sr(DPM)_2$, and $Ti(OC_3H_7)_4$, and $O_2$ at 0.5 Torr and 410° C., where "DPM" denotes dipivaloylmethanato. The oxide can be substantially amorphous or crystalline as formed depending in large part on the processing temperature, with a substantially amorphous layer being formed from the above precursor gases at a temperature of 410° C. Substrate 10 and accordingly high K capacitor dielectric layer 26 will then subjected to one or more annealings in the presence of oxygen atoms, for example as described above in the "Background" section.

Either during deposition of dielectric layer 26 or during its subsequent anneal, oxygen atoms can diffuse into electrode 24. Yet, interaction of such diffusing oxygen atoms with the subject additional or another metal provided within layer 24 is intended to result in reaction to form a conductive metal oxide, and thus in essence function as a barrier or restriction to undesired oxygen diffusion to the silicon of plug 20. The subject conductive oxides that form are generally also inherently good barriers to further oxygen diffusion.

Figure 2:
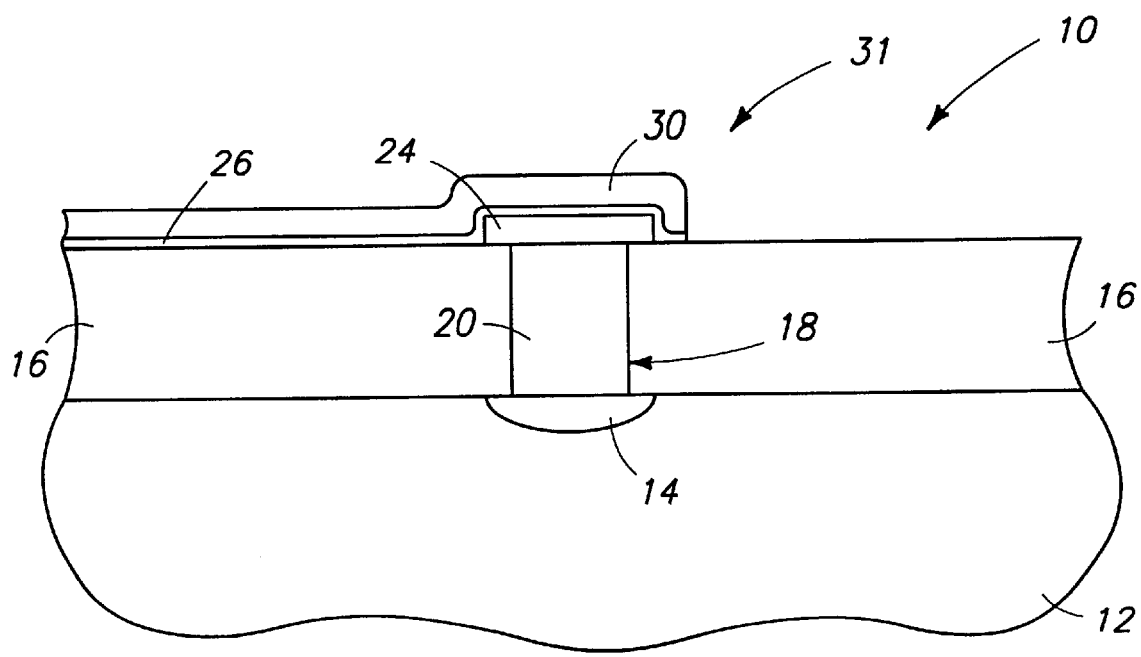
FIG. 2 is a view of the FIG. 1 wafer at a processing step subsequent to that depicted by FIG. 1.

A second capacitor electrode layer 30 is thereafter deposited over capacitor dielectric layer 26. A preferred material for layer 30 is TiN. A diffusion barrier layer might also be provided intermediate layers 26 and 30. The layers are subsequently patterned to form capacitor 31 (FIG. 2).

After fabrication and depending upon the degree of oxygen diffusion and reaction to form conductive metal oxides, capacitor electrode 24 will include a combination of at least one of platinum and palladium (or a mixture thereof), the additional unreacted metal, and conductive metal oxide produced from the reacted additional metal. Whether present in metallic form or conductive metal oxide, the presence of the combination of these two materials in the preferred embodiment will be less than or equal to 10% atomic, with a concentration of from about 0.5% to about 5% atomic being preferred. Further preferably, capacitor electrode 24 predominately comprises some combination of Pt and/or Pd, the additional unreacted metal, and conductive metal oxide produced from the reacted additional metal. Most preferably, capacitor electrode 24 consists essentially of some combination of Pt and/or Pd, the additional unreacted metal, and conductive metal oxide produced from the reacted additional metal.

Figure 3:
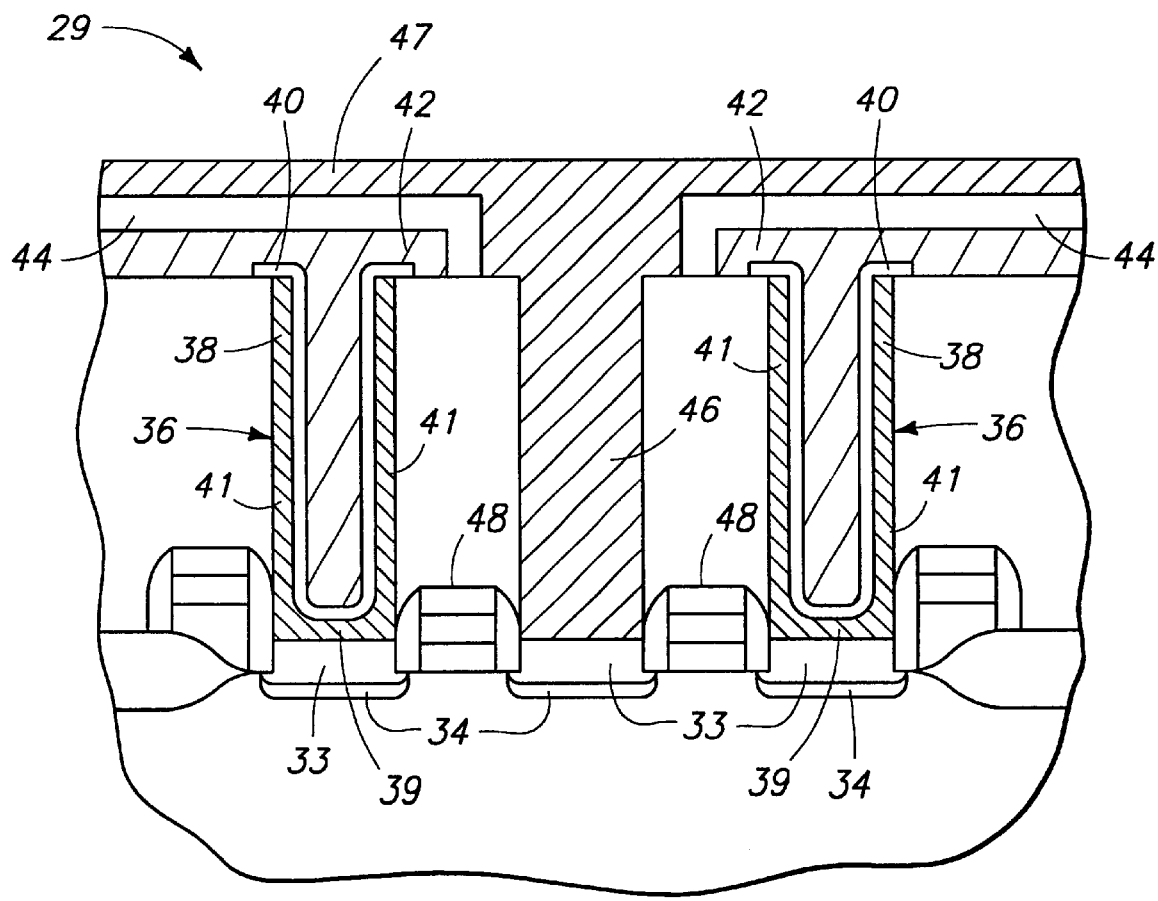
FIG. 3 is a view an alternate embodiment semiconductor wafer fragment processed in accordance with the invention.

FIG. 3 depicts implementation of the invention in fabrication of DRAM circuitry. A wafer fragment 29 comprises two memory cells, with each comprising a capacitor 36 and a shared bit contact 46. Capacitors 36 electrically connect with substrate diffusion regions 34 through silicide regions 33. For simplicity, capacitors 36 are shown as comprising a first capacitor electrode 38, a capacitor dielectric layer 40, and a second capacitor electrode/cell plate 42. Such can be fabricated of materials described above, preferably to include silicon, barrier layers and a high K oxygen containing capacitor dielectric layer. The high K oxygen containing capacitor dielectric layer is preferably processed as described above. A dielectric layer 44 is formed over second capacitor plate 42. A bit line 47 is fabricated in electrical connection with bit contact 46. Word lines 48 are fabricated to enable selective gating of the capacitors relative to bit contact 46.

First capacitor electrodes 38 respectively can be considered as having a base 39 and a pair of walls 41 projecting upwardly therefrom. As depicted, such is in the form of a container-like shape, with base 39 being substantially horizontally oriented and with walls 41 being perpendicularly oriented thereto. Preferably, base 39 is fabricated to have a greater concentration of the additional metal than any concentration of the additional metal in walls 41. This will particularly result where the additional metal is provided after initial layer 38 deposition by subsequent ion implantation. Further, this is a region where the greatest concentration of such a material is desired, for example where an interface occurs with underlying silicon or silicide. In one considered embodiment, FIG. 3 depicts integrated circuitry in the form of DRAM, with base 39 having greater concentration of one or both of the another metal and conductive oxygen than occurs in walls 41.

Although both of the above preferred embodiments show the bottom capacitor electrode as comprising the Pt, Pd, conductive metal oxide and/or additional metal, the top capacitor electrode could alternately or additionally be formed to comprise such materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:

providing a conductive silicon containing electrode projecting from a circuit node;

forming a first capacitor electrode over and in electrical connection with the conductive silicon containing electrode, the forming comprising forming the first capacitor electrode to comprise at least one of Pt and Pd, and also comprising another metal which is capable of forming a conductive metal oxide when exposed to oxidizing conditions, the first capacitor electrode having a base and a pair of walls projecting upwardly therefrom, the base having a greater concentration of the another metal than concentration of the another metal in the walls;

forming a capacitor dielectric layer over the first capacitor electrode; and forming a second capacitor electrode over the high K capacitor dielectric layer to form a capacitor comprising the first capacitor electrode, the high K capacitor dielectric layer and the second capacitor electrode.

2. The method of claim 1 wherein the forming of the first capacitor electrode comprises ion implanting of the another metal.

3. A method of forming integrated circuitry comprising:

providing a conductive silicon containing electrode projecting from a circuit node;

forming a first capacitor electrode over and in electrical connection with the conductive silicon containing electrode, the forming comprising forming the first capacitor electrode to comprise at least one of Pt and Pd, and a conductive metal oxide, the first capacitor electrode having a base and a pair of walls projecting upwardly therefrom, the base having a greater concentration of the conductive metal oxide than concentration of the conductive metal oxide in the walls;

forming a capacitor dielectric layer over the first capacitor electrode; and forming a second capacitor electrode over the high K capacitor dielectric layer to form a capacitor comprising the first capacitor electrode, the high K capacitor dielectric layer and the second capacitor electrode.

4. A method of forming a capacitor comprising:

forming a first capacitor electrode over a substrate, the forming comprising forming the first capacitor electrode to comprise at least one of Pt and Pd, and also comprising another metal which is capable of forming a conductive metal oxide when exposed to oxidizing conditions, the first capacitor electrode having a base and a pair of walls projecting upwardly therefrom, the base having a greater concentration of the another metal than concentration of the another metal in the walls;

forming a capacitor dielectric layer over the first capacitor electrode; and forming a second capacitor electrode over the high K capacitor dielectric layer to form a capacitor comprising the first capacitor electrode, the high K capacitor dielectric layer and the second capacitor electrode.

5. The method of claim 4 wherein the forming of the first capacitor electrode comprises ion implanting of the another metal.

6. A method of forming a capacitor comprising:

forming a first capacitor electrode over and in electrical connection with the conductive silicon containing electrode, the forming comprising forming the first capacitor electrode to comprise at least one of Pt and Pd, and a conductive metal oxide, the first capacitor electrode having a base and a pair of walls projecting upwardly therefrom, the base having a greater concentration of the conductive metal oxide than concentration of the conductive metal oxide in the walls;

forming a capacitor dielectric layer over the first capacitor electrode; and forming a second capacitor electrode over the high K capacitor dielectric layer to form a capacitor comprising the first capacitor electrode, the high K capacitor dielectric layer and the second capacitor electrode.

* * * * *

UNITED STATES PATENT AND TRADEMARK OFFICE
CERTIFICATE OF CORRECTION

PATENT NO. : 6,255,186 B1
DATED : July 3, 2001
INVENTOR(S) : Husam N. Al-Shareef et al.

Page 1 of 1

It is certified that error appears in the above-identified patent and that said Letters Patent is hereby corrected as shown below:

Column 2,
Line 46, replace "capable; of" with -- capable of --.

Column 3,
Line 53, replace "embodiment faith" with -- embodiment with --.

Column 6,
Line 22, replace "forming a capacitor" with -- forming a high K capacitor --.
Line 44, replace "forming a capacitor" with -- forming a high K capacitor --.
Line 62, replace "forming a capacitor" with -- forming a high K capacitor --.

Column 8,
Line 3, replace "forming a capacitor" with -- forming a high K capacitor --.

Signed and Sealed this

Twelfth Day of March, 2002

*Attest:*

*Attesting Officer*

JAMES E. ROGAN
*Director of the United States Patent and Trademark Office*